United States Patent [19]

Jordan et al.

[11] 4,243,432
[45] Jan. 6, 1981

[54] SOLAR CELL ARRAY

[75] Inventors: John F. Jordan; Curtis M. Lampkin, both of El Paso, Tex.

[73] Assignee: Photon Power, Inc., El Paso, Tex.

[21] Appl. No.: 945,312

[22] Filed: Sep. 25, 1978

Related U.S. Application Data

[62] Division of Ser. No. 831,544, Sep. 8, 1977, Pat. No. 4,181,476.

[51] Int. Cl.³ .............................................. H01L 31/06
[52] U.S. Cl. .................................... 136/244; 136/260; 427/74
[58] Field of Search ............ 136/89 P, 89 EP, 89 MS, 136/89 TF, 89 CD

[56] References Cited

U.S. PATENT DOCUMENTS

| 3,713,893 | 1/1973 | Shirland | 136/89 |
| 3,971,672 | 7/1976 | Lampkin | 136/89 |
| 3,977,904 | 8/1976 | Köhler | 136/89 |
| 4,042,418 | 8/1977 | Biter | 136/89 P |

FOREIGN PATENT DOCUMENTS

| 1,037,466 | 9/1953 | France | 136/89P |
| 1,564,935 | 6/1970 | Fed. Rep. of Germany | 136/89P |

*Primary Examiner*—Aaron Weisstuch
*Attorney, Agent, or Firm*—Bard & Groves

[57] ABSTRACT

An array of photovoltaic cells in a back wall-type configuration supported by a rigid transparent vitreous substrate, such as glass, for admitting incident radiation to the cells. A plurality of cells are interconnected into a desired electrical configuration by one or more layers of electrically conducting materials which overlie substantially the entire heterojunction of each cell to minimize the internal resistance of the cell and may conveniently protect the heterojunction from degrading environmental conditions. The conducting layer interconnects an exposed electrode region of one cell with the heterojunction forming material of the adjacent cell while remaining insulated from any intervening cell structure. In one embodiment, the uppermost conducting layer is lead, which seals the underlying materials from atmospheric constituents, such as oxygen and water vapor, while remaining relatively inert to such constituents.

22 Claims, 19 Drawing Figures

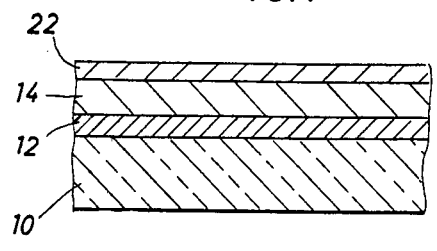
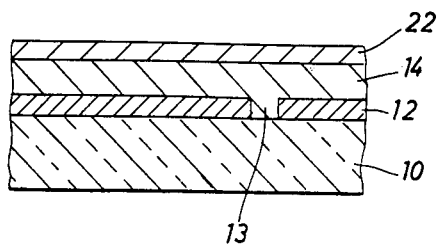
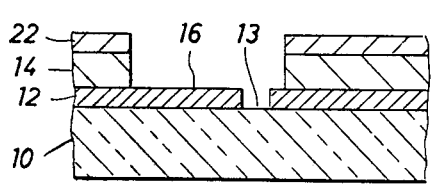
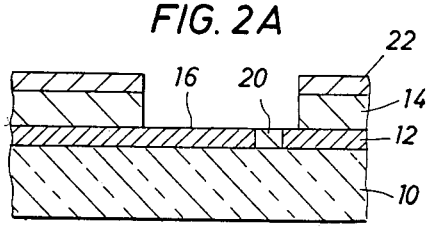
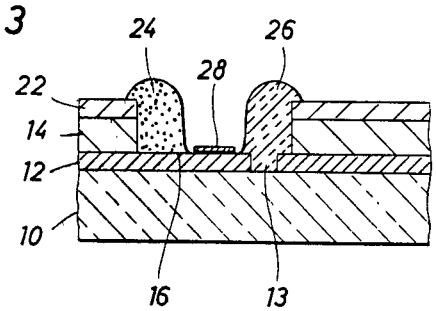
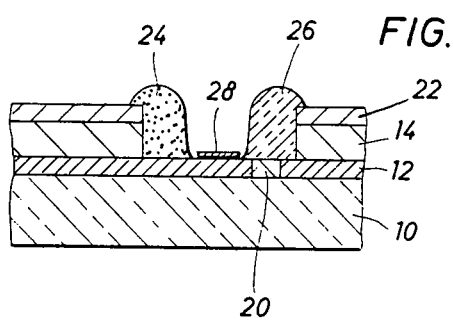
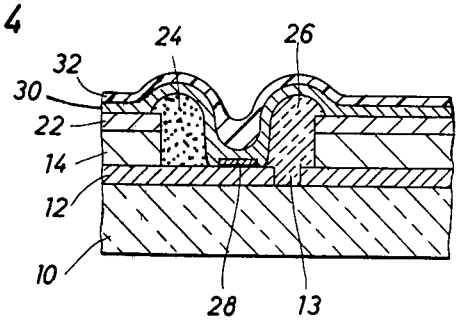
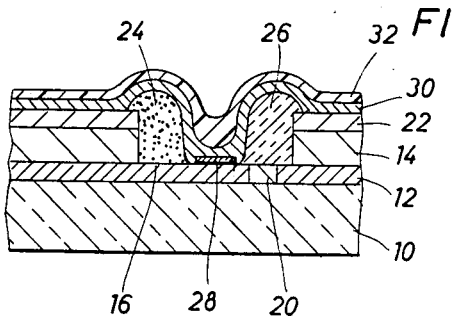
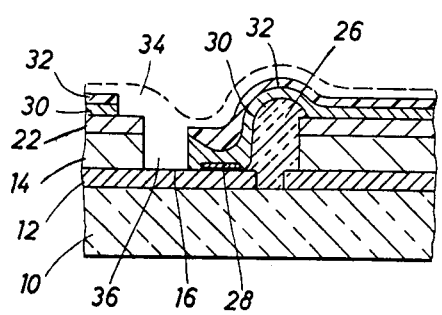
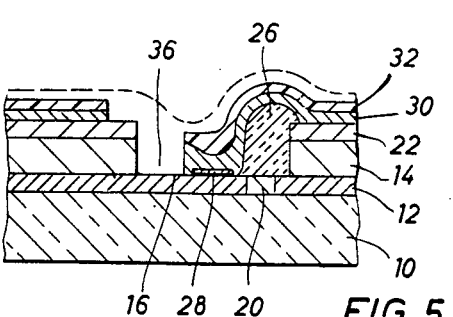

SOLAR CELL ARRAY

RELATED CASES

This case is a divisional application from U.S. patent application Ser. No. 831,544 filed Sept. 8, 1977 now U.S. Pat. No. 4,181,476.

FIELD OF THE INVENTION

This invention relates generally to large area photovoltaic cells which can be produced and interconnected for large scale terrestrial use and, more particularly, to a photovoltaic panel which is formed using mass production techniques, such as spray application of layers, and thereafter formed into an array of series connected solar cells and wherein the individual cells are formed by film removal apparatus.

BACKGROUND OF THE INVENTION

The search for alternate energy sources in the United States and throughout the world is progressing at an ever increasing rate as the available supplies of energy are being consumed. There are many alternate sources of energy which might be tapped but for technological and/or cost considerations. Solar energy is one source which is being extensively examined due to its abundance and to an apparent absence of environmentally deleterious side effects.

The technology and theory for producing basic photovoltaic cells which generate electrical energy in response to solar input is generally well known. The main technical problems which are currently under investigation deal with reducing this basic technology to a practice which is applicable to the production of such photovoltaic cells at a cost which is competitive with that required to construct and operate present day power generating facilities utilizing such energy sources as oil, coal, or nuclear fission. To accomplish this goal, it is apparent that electrical generating stations utilizing photovoltaic cells must be fabricated using mass production techniques wherein large areas, measured in terms of square miles, can be literally covered with such mass-produced photovoltaic cells. In accordance with the present invention, large area photovoltaic panels will be formed using production-type techniques and will thereafter be formed into an array of series connected photovoltaic cells in a process suited to mass production and in a size to generate commercial quantities of electrical energy.

THE PRIOR ART

The production of first-generation photovoltaic cells required that a single crystal of silicon or cadmium sulfide be grown and then sliced into thin wafers to form the semiconductor layers. By this technique, discrete solar cells were constructed by building up a layered cell from a plurality of discrete elements bonded together to form the completed cell. This production operation, in itself, was expensive and produced only small area photovoltaic cells because of the requirement to form the semiconductor materials responsive to incident solar radiation from single crystal materials.

To obviate the cost and size problems inherent in the use of single crystal materials, polycrystaline materials have been developed which are suitable for use in forming photovoltaic cells which are considerably larger than the cells which can be obtained from single crystal materials. Typically, suitable semiconductor materials are composed of compounds from elements in Groups II and VI of the periodic table. Cadmium sulfide has been found to be a particularly suitable compound which may be formed from numerous chemical compounds containing cadmium and sulfur and applied to a substrate in a variety of processes to interact and form a layer of cadmium sulfide which exhibits semiconductor properties.

A completed photovoltaic cell which is well known in the art includes a layer of polycrystaline cadmium sulfide (CdS) disposed on a suitable substrate, and a second material which forms a heterojunction, or "barrier layer", in cooperation with the CdS. The material typically used to form a heterojunction with CdS is cuprous sulfide, $Cu_xS$, where x is less than 2 for non-stoichiometric cuprous sulfide formed over the CdS. The technology to mass produce photovoltaic cells which incorporate the $CdS-Cu_xS$ heterojunction is rapidly developing and is not, per se, a subject of the instant invention.

To provide for large scale terrestrial application, the individual photovoltaic cells must be formed into an interconnected array covering large areas. Typically, a single $CdS-Cu_xS$ heterojunction will produce an open circuit voltage of 0.40–0.54 volts. If a higher output voltage is desired in order to transmit or use directly the output power from the photovoltaic cell array, the individual cells may be connected in a series arrangement to produce output voltages of 12–24 volts, i.e., output voltages which are equivalent to voltages produced by present day storage batteries.

Early attempts to provide photovoltaic arrays generally consisted of taking individual photovoltaic cells, adhering those cells to a common substrate, and then interconnecting the photovoltaic cells with wire conductors to complete the array. U.S. Pat. No. 3,411,050 is illustrative of such prior art. These photovoltaic arrays were custom fabricated and were expensive to produce. The requirement to provide physical connections for large numbers of conductor wires further reduced the availability of surface area for active photovoltaic power generation and thereby reduced the overall efficiency of the photovoltaic array.

The availability of polycrystalline CdS as a component in a photovoltaic cell has greatly increased the capability of forming a series connected array of such cells. U.S. Pat. Nos. 3,483,038; 3,571,915 and 3,713,893 are typical of recent prior art attempts to provide a solar cell array. In these prior art arrays, the polycrystalline cadmium sulfide layer is formed by masking and vacuum-evaporating cadmium sulfide onto the surface of a suitable substrate, which is generally a flexible plastic or metallic foil, and then vacuum evaporating or depositing a slurry to produce a cuprous sulfide layer over the cadmium sulfide and form the heterojunction. It may be appreciated that this method is time consuming and is not well adapted to mass production of large scale panel arrays where the cells are series connected. It should also be noted that the plastic substrate materials require that a low-temperature process, such as vacuum deposition, be used to form the required layers, since the plastic cannot be subjected to high temperatures.

Further, the photovoltaic arrays taught by the above references generally utilize front wall-type solar cells, wherein solar radiation is directly incident on the heterojunction and the substrate is generally opaque to light. In a front wall-type solar cell, the electrode applied to the heterojunction (the $Cu_xS$ layer) is formed in grid-like pattern in order to admit light through to the heterojunction. The use of the grid-like electrode subjects the $Cu_xS$ layer to possible degradation during application of the grid or during subsequent exposure of the $Cu_xS$ to the environment. In some fabrication techniques, the grid is affixed to the cell by an adhesive, whereby oxidation of the $Cu_xS$ tends to occur when the adhesive is cured. Also, exposure of the $Cu_xS$ to the oxygen and water vapor in the air can degrade the material during normal cell operation.

In addition to the inefficiencies inherent in a front wall-type solar cell from using a grid, i.e., covering a portion of the active heretrojunction area and a possible degradation of the heterojunction, a front wall-type solar cell has an inherent optical mismatch. The indices of refraction of cuprous sulfide and cadmium sulfide are 3-3.5 and about 2.5, respectively. Accordingly, light incident on the heterojunction at angles greater than the critical angle for the $Cu_xS$—CdS interface, 35° to 55° depending on the particular indices of refraction, will be reflected rather than transmitted. Further, the abrupt large increase in the index of refraction in passing from air to cuprous sulfide results in an intensity of reflected light which is greater than the intensity of the same radiation reflected from a glass surface having a typical index of refraction around 1.50.

An evolving technique for producing photovoltaic cells with polycrystalline CdS is to spray suitable solutions onto a substrate where the solution reacts to form a film of the desired material. U.S. Pat. Nos. 3,880,633 and 3,902,920 to Jordan et al, disclose suitable techniques for forming large area back-wall type photovoltaic cells by the spray method. A glass substrate is moved through a series of spray booths to form layered films of tin oxide, cadmium sulfide, and perhaps cuprous sulfide. It is a feature of these spray processes that each film is formed at a temperature lower than that at which the preceding film is formed. Accordingly, it would be desirable to form the large photovoltaic panel into some number of smaller cells, to be connected in series for increased voltage outputs, only after all of the layers have been formed. Such a technique would minimize the thermal cycling of the glass and the energy required to produce the photovoltaic panel.

The disadvantages of the prior art are overcome by the present invention, however, and improved methods are provided for obtaining an array of photovoltaic cells connected in series. Further, an improved array of series connected photovoltaic cells on a common substrate is provided.

SUMMARY OF THE INVENTION

A method is provided for forming a large area photovoltaic cell into a plurality of discrete photovoltaic cells on a common substrate. A large area photovoltaic cell is first produced by forming layered films over substantially an entire surface of a transparent substrate. Portions of the films are thereafter selectively removed to form a plurality of smaller photovoltaic cells. Finally, a conducting material is applied to interconnect the photovoltaic cells into an array.

An improved array of photovoltaic cells is produced on a transparent vitreous substrate, such as glass or the like. A back-wall photovoltaic cell array is thus provided which can be formed by using a spray process to produce a large area photovoltaic cell and then removing the films to obtain a plurality of cells. The vitreous substrate permits film formation at high temperatures and is thereafter resistant to mechanical or chemical film removal techniques.

A further improved array of photovoltaic cells is provided wherein layered films form the composite photovoltaic heterojunction structure and attached electrodes. Substantially the entire surface area of a substrate is covered with each film and only those portions of each layer are removed which must be removed to form a plurality of photovoltaic cells on the substrate and to form the series electrical interconnections between the cells. The conducting material contacting the heterojunction seals and protects the underlying materials while interconnecting the photovoltaic cells into a suitable array.

It is a particular feature of the present invention to produce a series connected photovoltaic array by first forming the various films which form the photovoltaic cell heterojunction over the entire substrate and thereafter removing selected portions of the films to form the array.

It is another feature of the present invention to substantially cover the entire panel with each material layer to obviate the need for elaborate masking techniques.

It is a feature of the present invention to provide a photovoltaic cell array in which all the photovoltaic cells are formed on a glass substrate which provides the illuminated surface.

It is a feature of the present invention that a photovoltaic array is provided in which the film area which must be removed to form and interconnect the plurality of photovoltaic cells, and not therefore available as an active power generating area, is greatly reduced.

It is a feature of the present invention that the electrically conducting film on the substrate and the CdS film can be formed by means of a spray technique covering the entire panel and portions of the films thereafter removed to form individual photovoltaic cells.

It is a feature of the present invention that the solar cell panels be conveniently interconnectable into a power generating array, where such array may cover an extremely large area to provide for large scale production of electrical power.

It is a feature of the present invention to remove portions of the layered films which form the large area photovoltaic cell by cutting through the films.

It is a feature of the present invention that the conducting electrode material contacting the materials forming the heterojunction serves to seal and protect the heterojunction.

It is a feature of the present invention to form a series connected array of photovoltaic cells having a plurality of electrically isolated conductive films on a substrate panel, first and second heterojunction-forming semiconductor layers overlying the conductive films and a conductive layer forming the series connections, by performing the steps of forming at least one semiconductor film over the entire substrate panel and covering the plurality of conductive films, and thereafter cutting through a selected portion of the semiconductor film to form the plurality of photovoltaic cells.

It is a feature of the present invention to provide an apparatus for generating electrical energy, comprising a rigid transparent vitreous substrate member, and a plurality of interconnected photovoltaic cells formed on and functionally responsive to solar rays traversing the substrate member.

Other and further objects, advantages and features will become apparent from the following detailed description, wherein reference is made to the figures in the accompanying drawings.

DESCRIPTION OF THE DRAWINGS

FIGS. 1 and 1A are a cross section of a photovoltaic panel on which the basic photovoltaic layers have been applied.

FIGS. 2 and 2A are cross-sectional views of a photovoltaic panel from which film material has been removed to form a plurality of photovoltaic cells.

FIGS. 3 and 3A are cross-sectional views of a photovoltaic panel prepared to receive an overlying conductive coating.

FIGS. 4 and 4A are cross-sectional views of a photovoltaic panel over which electrically conductive layers have been applied.

FIGS. 5 and 5A are cross-sectional views of a photovoltaic panel of series connected photovoltaic cells sealed from the environment.

DETAILED DESCRIPTION

Figure 9:
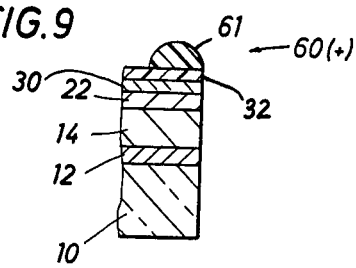
FIGS. 9 and 9A are cross-sectional views showing the electrode configurations at the photovoltaic panel ends.

Referring now to the drawings and first to FIGS. 1–5, there may be seen cross-sectional views, illustrating a preferred method for forming an interconnected solar cell array where the negative electrode layer is formed over the entire panel and formed into electrode areas electrically isolated from adjacent negative electrode areas as the overlying heterojunction-forming films are selectively removed. FIGS. 1A–5A illustrate an alternate method where the negative electrode is separated into a plurality of negative electrode areas prior to forming the overlying films.

Referring now to FIGS. 1–5 and first to FIG. 1, there may be seen a cross section of a substrate panel 10 coated with layered films of $SnO_x$ 12, CdS 14 and $Cu_xS$ 22. These layers cooperate to form a large area photovoltaic cell and are initially formed over the entire substrate panel 10. At this stage, the entire panel is, in fact, a large photovoltaic cell and would produce electrical power at low voltage and high current if electrodes were now attached to the panel.

After the entire panel has been coated with the semiconductor materials, the photovoltaic panel is then formed into a plurality of photovoltaic cells, as shown in FIG. 2. The $Cu_xS$ film 22 and CdS film 14 are removed from above a portion of the $SnO_x$ film 12 to expose a selected pattern of the $SnO_x$ film surface 16. In one embodiment of the present invention, a strip of $SnO_x$ approximately one millimeter wide is exposed. The width of the exposed strip is selected to accommodate the various insulating films and other materials formed over the $SnO_x$ and needed to form the electrical interconnections. Films 22 and 14 may be conveniently removed by a tool suitable for cutting the films from the surface, such as a tool bit or rotating cutting tool.

Referring again to FIG. 2, the $SnO_x$ film 12 must be removed along one edge of the area from which the overlying semiconductor films 22 and 14 have been removed. The $SnO_x$ film 12 is a hard, tightly adherent film and cannot be as readily removed by mechanical processes as the CdS 14 and $Cu_xS$ 22 films. Accordingly, a process may be chosen which essentially vaporizes a small portion of the film so that each photovoltaic unit is electrically isolated at this stage from adjacent photovoltaic units. A preferred technique for vaporizing the $SnO_x$ film to form gap 13 is by means of a low voltage probe, typically at about 20 volts d.c., which creates an electrical arc along the $SnO_x$ to vaporize the $SnO_x$ to be removed. The $SnO_x$ film might also be removed by means of a focused laser beam concentrated so as to vaporize the small area of $SnO_x$ to be removed. Further, it is possible to remove a selected portion of $SnO_x$ to form gap 13 by conventional masking and chemical etching methods which are conventionally employed in fabricating semiconductor devices, such as illustrated by U.S. Pat. No. 4,009,061 to Simon.

Once a plurality of photovoltaic cells has been formed and electrically isolated, one from the other, the units must then be connected to form the series array of photovoltaic cells. As shown in FIG. 3, the photovoltaic units must be prepared to receive the overlying layers of conducting materials which are to be applied. The exposed edges of semiconducting layers 14 and 22 are first coated with suitable electrically insulating materials. It has been found that insulating film-forming material used in conventional masking operations for chemical etching may be used. A first insulating film 24 is formed along the edge of the layers which is immediately adjacent the exposed strip 16 of $SnO_x$. A second insulating film 26 is formed over the exposed edges of the semiconducting layers of the adjacent photovoltaic unit and to completely fill gap 13. Insulating films 24 and 26 may be formed from the same material or from different materials where needed, as hereinbelow discussed.

Insulating films 24 and 26 may be formed from a variety of materials to which the semiconductor layers 14 and 22 do not react in such a manner as to result in any degradation of the semiconducting properties of the materials. Materials which have been successfully used include a photo-resist marketed under the trademark KMER by Kodak, polyvinyl chloride films, acrylic paint, and cellulose film formers. Where insulating film 24 is to be removed, the film 24 may be formed from asphalt based printing inks or solvent based strippable film forming materials, which are well known in the printing industry and the etching industry. The method of applying these insulating materials is conventionally through a needle-like pen having a fairly large aperture such that the insulating material may be applied as a high solid content slurry with just enough solvent to enable the slurry to flow through the pen.

Referring again to FIG. 3 there may be seen an "adhesive strip" 28 formed on the surface of the $SnO_x$ strip 16. The adhesive 28 may be applied for the purpose of insuring better electrical contact and an adhering bond between the overlying conducting layers, which are to be applied, and the underlying $SnO_x$ layer 12. The need for adhesive strip 28 is determined by the actual overlying conductor material which is applied. In one embodiment, a rotating brass wheel is used to deposit a small amount of brass directly on the exposed $SnO_x$ 16 by frictional contact between the rotating wheel and exposed strip 16. Brass is particularly compatible with an overlying copper layer. Other materials which are suitable for forming adhesive strip 28 include zinc, indium, cadmium, tin, and bronze, and alloys thereof.

Referring now to FIG. 4 there may be seen a photovoltaic panel with the overlying conductor layers formed over the surface of the underlying substrate and photovoltaic cells. It is preferred to cover the entire substrate area with conductive materials and this may conveniently be accomplished by vacuum-evaporating one or more conductive materials over the surface. As shown in FIG. 4, a first conductor layer 30 is vacuum-evaporated over the entire area of the substrate and layer 30 may conveniently be copper which forms a satisfactory bond with the $Cu_xS$ layer 22 and the adhesive strip 28. Thus, an integral interconnection is formed between the overlying positive electrode and the transparent negative electrode. Finally, a layer of lead 32 may be applied over the layer of copper 30 to further provide a conductive path for the electrical current and to protect the copper 30 from oxidation and other damage during subsequent fabrication of the cells into photovoltaic structures suitable for installation in a large scale array. It should be noted, however, that copper and lead tend to form an alloy at the junction of the two metals when the cell is heated subsequent to forming both layers. Thus, a very thin barrier film a few angstroms thick may be required at the junction to prevent direct contact between the lead and copper. A suitable physical barrier may be formed from oxidized copper, iron or inconel.

In one aspect of the present invention the layer of lead serves to protect the $Cu_xS$ layer from degradation and prolong the life of the photovoltaic heterojunction. Normally, cuprous sulfide is quite susceptible to degradation in the presence of oxygen and water, such as would occur if the layer were exposed to the atmosphere for front wall-type operation. Transparent conductors have not been available to cover the cuprous sulfide layer and protect the layer. Thus, grid-like electrode configurations have been required with a further covering needed to seal the cell. The back wall-type photovoltaic cell which is the subject of the present invention does not require illumination of the cuprous sulfide layer so a solid electrode may be used which may also seal and protect the cuprous sulfide layer.

It has been found that multi-layer conductors of copper and lead provide many advantages. The copper adheres well to the cuprous sulfide and also helps to maintain the stoichiometry of the cuprous sulfide. However, copper alone is somewhat permeable to oxygen and water vapor. A second layer formed of lead over the copper then seals the copper. Lead is also a conductor and thus serves to improve the overall conductivity of the overlying conducting material while protecting the $Cu_xS$.

Referring now to FIG. 5 there may be seen a cross-sectional view of a completed panel of photovoltaic cells which are connected in series. A portion of overlying electrical conducting layers 30 and 32 form an electrical contact with a portion of the exposed $SnO_x$ strip 16, which electrical contact may be improved by means of adhesive strip 28. Conducting layers 30 and 32 then extend over the $Cu_xS$ layer 22 of the adjacent photovoltaic cell and are insulated from contact with any other portion of the adjacent photovoltaic cell by insulation 26. Since the $SnO_x$ layer is the negative electrode of one photovoltaic unit and the $Cu_xS$ layer forms the positive portion of the adjacent unit, the photovoltaic units are thereby connected electrically in a series arrangement. If desired, the layered surface of the photovoltaic panel may then be covered with a suitable sealant 34 for protection against exposure to detrimental environmental conditions.

It will be appreciated from the above discussion that the entire operation for forming the series connected photovoltaic units is one which is well adapted to a mass production process. The steps of forming the individual photovoltaic units, applying the insulating strips and the adhesive strip may all be done by a suitable machine making a single pass across the surface of the coated substrate. If desired, a plurality of devices may be used so that the entire panel is prepared at one time and the panel need be accurately positioned only once. The subsequent step of forming the metallic conducting layers 30 and 32 by vacuum evaporation can be readily accomplished on a production basis, although it is more expensive than the spray methods for forming the other films. As hereinbelow discussed, a variety of techniques are available for selectively removing portions of the overlying conductor films 30 and 32 so as to form the completed array.

Referring again to FIG. 5, insulating strip 24 has been removed along with the portion of conductor layers 30 and 32 overlying insulating strip 24. In one conventional technique this is accomplished by using an insulating film 24 (shown in FIG. 4) which is removable by means of ultrasonic vibrations whereupon the overlying conductor layers 30 and 32 are deprived of their structural backing and are also removed by the ultrasonic vibrations. Insulating film 26 is chosen to maintain integrity at the ultrasonic frequency at which film 24 is removed. Thus, selected portions of the conductive films 30 and 32 are removed to obtain the desired electrical interconnection.

Referring now to FIGS. 1A-5A, there may be seen a cross-section of a substrate panel 10 where the $SnO_x$ 12 areas are already formed and electrically isolated from one another. This condition might occur if a defective panel is being reprocessed or if it is desired to begin the CdS coating with the $SnO_x$ already removed. Removal of the $SnO_x$ to form the isolated electrode areas may be accomplished as hereinabove discussed for the step illustrated by FIG. 2. Because of the progressive nature of the temperatures used in forming a photovoltaic panel by the spray technique, it is desirable to remove the $SnO_x$ without having to cool the entire panel to room temperature and subsequently reheat. In such a case, a preferred method would use the low voltage probe method to affect film removal prior to forming the CdS layer 14.

Once the entire substrate has been coated with the heterojunction-forming films, CdS layer 14 and $Cu_xS$ layer 22, selected portions of these films are removed as per the discussion related to FIG. 2, above. Further, as shown in FIG. 2A, the removed portion of $Cu_xS$ film 22 and CdS film 14 is superposed above the area from the $SnO_x$ film 12 has been removed so that a small portion of CdS 20 remains in the isolation gap which is located substantially along an edge of the area from which the overlying films have been removed.

Referring again to FIG. 1A and 2A, there may been seen gap 13 filled with a portion of the CdS 20. This occurs where the $SnO_x$ is removed prior to forming the semiconductor films, in order to avoid any possibility of damage to the overlying semiconductor materials from the heat generated in film vaporization. The CdS material 20 which fills gap 13 obtains a different crystalline structure from the CdS microcrystals which are formed directly on the $SnO_x$ layer. It is believed that the CdS material 20 in gap 13 will have a much higher specific resistivity than found in CdS film 14 and will act to insulate between adjacent $SnO_x$ film 12 regions. Accordingly, it is expected that CdS material 20 may be merely left in gap 13 when the overlying semiconductor regions 22 and 14 are removed.

FIGS. 3A, 4A and 5A illustrate the steps of forming insulating films 24 and 26, laying down insulating strip 28, forming conductor layers 30 and 32, and thereafter removing portions of the conductor layers to produce the desired electrical interconnection. The steps are performed in a manner identical to the steps described for FIGS. 3, 4 and 5 and the resulting photovoltaic array is available for the production of electrical energy.

Figure 6:
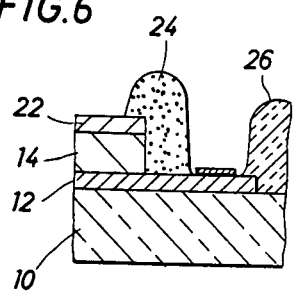
FIGS. 6, 6A and 6B illustrate formation of the series connection by a slicing technique.
Figure 6A:
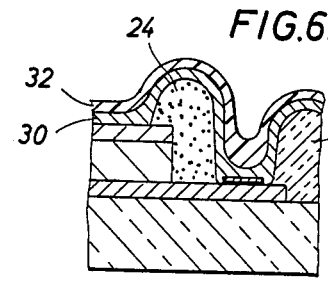
Figure 6B:
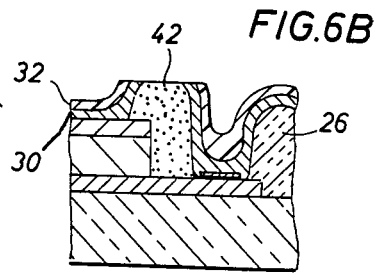

As hereinabove discussed, only the preferred method was presented for removing selected portions of the overlying conductor films in order to separate the photovoltaic cells and, simultaneously, form the integral series electrical connections which provide the interconnected array. An alternative technique to the use of ultrasonics for the removal of one insulating film and the overlying conductors is shown in FIGS. 6, 6A and 6B. As shown in FIG. 6, the photovoltaic panel has been formed and selected portions of the $SnO_x$ layer 12 and overlying films 14 and 22 removed to produce a plurality of photovoltaic cells on substrate 10. Insulating films 24 and 26 are applied as discussed hereinabove for FIG. 3 except that the applicator pens apply a larger volume of insulating film 24 whereby insulating strip 24 is formed to an elevation substantially greater than insulating strip 26. The difference in elevation between insulating strip 24 and 26 should be such that the top portion of insulating strip 24 will be higher than the top portion of insulating strip 26 after conductors 32 and 30 have been applied, as shown in FIG. 6A. It is then possible to cut through the top portion of insulating strip 24 and remove the overlying conductors 32 and 30 without removing the conducting films 32 and 30 from other portions of the photovoltaic panel. Thus, an insulating region 42 is formed, as shown in FIG. 6B, where the top portion of insulating strip 24 has been removed to again provide the series interconnection between adjacent photovoltaic cells. One advantage of this technique is that the desired interconnection is accomplished by merely passing the completed panel beneath a suitable cutting edge.

Figure 7:
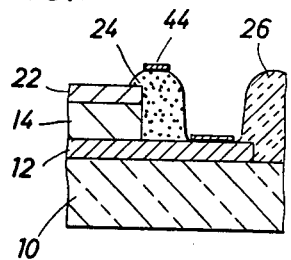
FIGS. 7, 7A and 7B illustrate formation of the series connection by a "tear" strip.
Figure 7A:
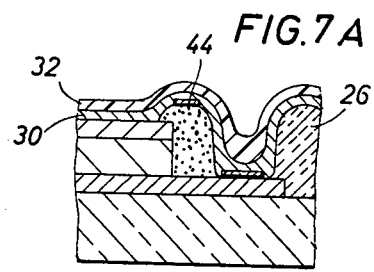
Figure 7B:
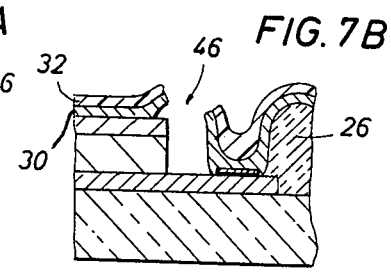

Referring now to FIG. 7, 7A and 7B, there may be seen yet another technique for removing conducting layers 30 and 32 to form the series connections. Again, a plurality of photovoltaic cells comprising $SnO_x$ layer 12, CdS layer 14 and $Cu_xS$ 22 have been formed on substrate 10 according to the methods hereinabove discussed for FIGS. 1 and 2. As shown in FIG. 7, insulating strips 24 and 26 have been formed. In addition, a tear strip 44 is placed on top of insulating strip 24. Tear strip 24 may be a metallic wire or any suitable material having sufficient tensile strength to cut through the thin conductor layers as hereinbelow discussed. As shown in FIG. 7A, the conductor layers 30 and 32 have again been formed over the entire surface of substrate panel 10 and, in particular, over tear strip 44. Tear strip 44 is formed to extend beyond the edges of substrate panel 10 such that tear strip 44 may be pulled upward and along insulating strip 24 to break through the overlying conductor layers 30 and 32 to isolate the photovoltaic units and form the series connection, as shown in FIG. 7B. FIG. 7B illustrates an isolation region 46 where insulation strip 24 has been removed, but insulating material 24 may also be left in place, if desired.

Figure 8:
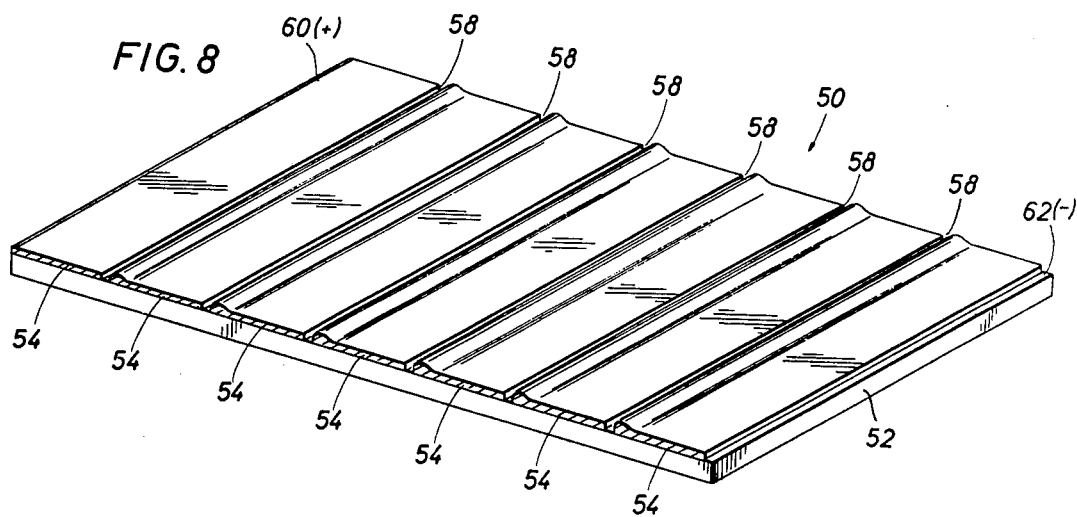
FIG. 8 is an isometric view of a completed photovoltaic panel formed according to the present invention (depth of the photovoltaic layers is exaggerated).

In a preferred embodiment (FIG. 8), substrate panel 52 is a transparent vitreous material such as glass, and the photovoltaic cells 54 are arranged on the glass in a back-wall configuration, i.e., with the CdS nearest the glass. The arrangement is particularly suitable for producing the initial large area photovoltaic cell by spray techniques. Each of the films on the glass substrate is formed successively and at progressively lower temperatures. Thus, the glass substrate needs to be heated to a high temperature only once and thereafter only reduced to lower temperatures. Production time is not consumed in having to repeatedly heat and cool the glass at prescribed rates to prevent excessive strains from developing. Further, glass is heat-resistant and can withstand the relatively high temperatures to produce the tin oxide and cadmium sulfide films.

A glass substrate is also particularly suited for forming the large area photovoltaic cells into smaller cells. The rigid support provided for the overlying films allows a cutting tool to be used for film removal. The heat resistance of the glass also permits the tin oxide to be removed by vaporization. Also, glass can withstand the chemical treatment necessary to remove the tin oxide by etching, if needed.

In forming the completed photovoltaic panel, several testing steps may be desirable. In particular, it is highly desirable to check the resistance between adjacent photovoltaic cells once the $SnO_x$ has been removed to insure the removal has been satisfactory to electrically isolate the photovoltaic units. It is a particular feature of the back wall array that each photovoltaic cell can be individually checked upon completing the array to particularly identify any defective cell which may be present. Further, the panel voltage must be checked after the overlying conducting layers have been separated to insure that the series connection has indeed been obtained. It should be noted that side strips (not shown) of the substrate panel 52 which are perpendicular to the photovoltaic cells are usually cut off after the panel has been formed in order to remove those portions which may be still electrically connected due to incomplete removal of overlying conducting layers.

It is now apparent that the photovoltaic panel, hereinabove described, is one well suited to providing a low cost photovoltaic cell suitable for large scale production of electrical power. Each photovoltaic panel covers a large area and is capable of handling such amounts of current whereby large quantities of power may be obtained at relatively low DC voltages of 18-24 volts. The internal resistance of the photovoltaic units is minimized by forming the $SnO_x$ layer in accordance with U.S. Pat. No. 3,880,633 wherein a process for forming a very low resistance $SnO_x$ film is disclosed. The tin oxide layer produced according to the subject patent has a sheet resistivity of about 5 to 10 ohms per square. This sheet resistivity allows a cell width of up to about two centimeters without producing unacceptable internal power losses within each cell.

Other advantages of the solar cell array according to the present invention include forming the large area photovoltaic cells in mass production, where spraying techniques are used to produce the plurality of layers forming the photovoltaic cells over the supporting substrate. Further, the active area of the entire photovoltaic panel is maximized since only small strips of the overlying films are removed, generally forming no more than about ten percent of the entire panel area, and the overlying conductors are formed as substantially continuous layers whereby a low resistance is obtained. Finally, the glass substrate inherently seals the radiation incident surface without restricting light admittance and the generally conterminous conductors seal the heterojunction surfaces to produce a panel which is substantially protected from atmospheric effects. It is expected that some final packaging may provide a final sealant for the exposed edges of the photovoltaic cells and a backing for physical protection, but no special packaging and sealing is otherwise required.

Figure 9A:
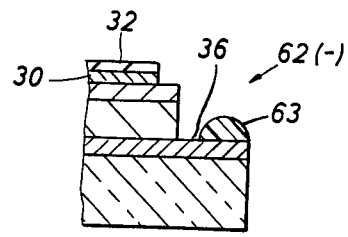

Referring now to FIGS. 9 and 9A, there are more particularly depicted the terminal regions of the completed photovoltaic panel 50 comprising the positive terminal 60 shown in FIG. 9 and the negative terminal 62 shown in FIG. 9A. Referring first to the positive terminal 60 shown in FIG. 9, a conductor is placed adjacent the conductor layer 32 and over the $Cu_xS$ layer 22. In a rudimentary embodiment, conductor 61 is a solder bead, such as a tin-lead alloy, deposited over the conductor layers 32 and 30. The volume of solder deposited to form conductor strip 61 should be as to maintain the current densities within the conductor strip at acceptably low levels to minimize resistance heating and energy losses. The material chosen to contact the conductor layer is selected to provide a work function compatible with the conductor layer for minimum contact losses. External connections may then be made to terminal strip 61 by soldering, clamping or other means of making suitable electrical contact.

Referring now to FIG. 9A, terminal strip 63 is formed in contact with an exposed portion 36 of the $SnO_x$ layer to provide a negative electrode. Terminal strip 63 may again be provided by an suitable connector, such as indium solder, as hereinabove discussed. Terminal strip 63 should be arranged out of contact with the semiconductor films 14 and 22 to prevent shorting out the films. This isolation may be obtained by simply making exposed $SnO_x$ surface 36 wide enough to accommodate terminal strip 63, or alternatively, by providing an insulating strip along the exposed surfaces of the overlying semiconductor and conductor layers, as hereinabove discussed for the steps for forming the series connection.

While the final means for supporting and interconnecting photovoltaic panel 52 into an overall network for generating commercial quantities of electrical energy is not the subject to which the present invention is directed, it should be noted that many suitable materials for forming terminal strips 61 and 63 exist and that such terminal strips need not be soldered in place but may be formed by physically urging suitable terminal strips 61 and 63 against the appropriate regions of the completed photovoltaic panel 52. The only requirement is that the positive terminal 60 be formed in contact with a $Cu_xS$ layer and that the negative terminal 62 be formed in contact with an $SnO_x$ layer and insulated from contact with film layers overlying the $SnO_x$.

It is therefore apparent that the present invention is one well adapted to attain all of the objects and advantages hereinabove set forth together with other advantages which will become obvious and inherent from a description of the process and products themselves. It will be understood that certain combinations and subcombinations are of utility and may be obtained without reference to other features and subcombinations. This is contemplated by and is within the scope of the present invention.

As many possible embodiments may be made of this invention without departing from the spirit or scope thereof, it is to be understood that all matters herein set forth in the accompanying drawings are to be interpreted as illustrative and not in any limiting sense.

What is claimed is:

1. A large area panel of photovoltaic cells, comprising:
   a transparent vitreous substrate member having at least one flat surface,
   a plurality of spaced photovoltaic cells formed in a backwall configuration on said flat surface, each of said cells having facing edges with adjacent ones of said cells;
   each of said cells having a transparent electrically conductive film adjacent said substrate, a semiconductor film containing elements from Groups II and VI of the Periodic Table and overlying said transparent film, a heterojunction formed on said semiconductor film, and a continuous solid conductive layer having a first portion overlying said heterojunction;
   said transparent film having an exposed portion along the length of one of said facing edges;
   said continuous solid conductive layer further having a second portion deposited in physical and series electrical contact conterminous along the length of said exposed portion of said transparent film of an adjacent photovoltaic cell.

2. The apparatus described in claim 1, wherein said photovoltaic cells include a CdS—$Cu_xS$ heterojunction.

3. The apparatus described in claim 1 wherein said vitreous substrate is glass.

4. A series connected large area array of photovoltaic cells forming a photovoltaic panel, comprising:
   a transparent substrate panel having at least one flat surface;
   a plurality of spaced transparent electrically conductive films each formed on a different selected portion of said flat surface and electrically isolated from other transparent conductive films formed on adjacent portions of said flat surface;
   a plurality of first semiconductor films each overlying and substantially covering all but an edge portion of its underlying transparent conductive film;
   a plurality of second semiconductor films each overlying and covering its underlying first semiconductor film and forming a corresponding plurality of photovoltaic heterojunctions on said panel;
   each of said films having facing edges with adjacent ones of said films; and
   at least one continuous solid layer of electrically conductive material deposited conterminously on each of said second semiconductor films and physically and electrically interconnecting each of said second semiconductor films to a facing adjacent one of said transparent conductive films conterminously along the length of said edge portion for electrically connecting said heterojunctions in series.

5. The array of photovoltaic cells according to claim 4, wherein each of said first semiconductor films is electrically insulated from directly contacting its overlying layer of electrically conductive material.

6. The array of photovoltaic cells according to claim 5, wherein each of said plurality of photovoltaic cells is a strip-like cell extending traversely across said panel.

7. The array of photovoltaic cells according to claim 4, claim 5, or claim 6, wherein said substrate panel is glass.

8. The array of photovoltaic cells according to claim 7, further including an adhesion-enhancing material formed at the junction between said transparent conductive film and said electrically conductive material.

9. The array of photovoltaic cells according to claim 4, wherein said transparent electrically conductive film is $SnO_x$.

10. The array of photovoltaic cells according to claim 4 or claim 9, wherein said first semiconductor film is a compound of elements selected from Groups II and Vi of the Periodic Table.

11. The array of photovoltaic cells according to claim 10, wherein said compound from Groups II and VI elements is CdS.

12. The array of photovoltaic cells according to claim 11, wherein said second semiconductor film is $Cu_xS$.

13. The array of photovoltaic cells according to claim 4, wherein said at least one layer of electrically conductive material seals said second semiconductor film.

14. The array of photovoltaic cells according to claim 4 or claim 13, wherein said at least one layer of electrically conductive material comprises:
a first layer of copper disposed over said second semiconductor material, and
a second layer of lead disposed conterminously over said layer of copper.

15. A large area array of photovoltaic cells formed on a common substrate, comprising:
a transparent vitreous substrate having at least one flat surface;
a plurality of spaced photovoltaic cells formed on said flat surface;
a transparent electrically conductive film adjacent said flat surface having a first portion coextensive with and underlying each of said cells and a second portion extending beyond each of said cells in facing relationship with an adjacent cell; and
a continuous solid conductive layer overlying each of said photovoltaic cells and deposited in physical and electrical contact conterminously along the length of said second portions of each of said transparent films;
said continuous solid conductive layer interconnecting said plurality of photovoltaic cells in a series electrical configuration.

16. Apparatus according to claim 15, wherein said photovoltaic cell includes a semiconductor film containing Cd.

17. Apparatus according to claim 16, wherein said transparent film is $SnO_x$.

18. Apparatus according to any one of claims 15, 16 or 17, wherein said electrically conductive layer includes lead.

19. Apparatus according to claim 15, wherein said electrically conductive layer includes at least one layer of electrically conductive material capable of retarding the entry of environmental oxygen and water vapor to said second semiconductor film.

20. Apparatus according to claim 19, wherein said at least one layer of electrically conductive material is lead.

21. Apparatus according to claim 20, further including a layer of metallic copper between said layer of lead and said at least one semiconductor film.

22. A large area array of photovoltaic cells, comprising:
a transparent vitreous substrate having at least one flat surface;
a plurality of strip-like photovoltaic cells spaced apart in adjacent parallel strips on said flat surface;
each of said photovoltaic cells comprising a transparent conductive film formed on said substrate, a semiconductor film containing elements from Groups II and VI of the Periodic Table overlying said transparent film, a heterojunction formed on said semiconductor film, and a continuous solid conductive layer overlying said heterojunction; and
extending portions of said continuous solid conductive layer integrally deposited in physical and series electrical contact conterminous along the length of parallel facing portions of an adjacent one of said transparent conductive films.

* * * * *